US006400192B2

United States Patent
Boezen et al.

(10) Patent No.: US 6,400,192 B2
(45) Date of Patent: Jun. 4, 2002

(54) ELECTRONIC CIRCUIT PROVIDED WITH A DIGITAL DRIVER FOR DRIVING A CAPACITIVE LOAD

(75) Inventors: Hendrik Boezen; Abraham Klaas Van Den Heuvel, both of Nijmegen (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/808,276

(22) Filed: Mar. 14, 2001

(30) Foreign Application Priority Data

Mar. 15, 2000 (EP) .............................................. 00200938

(51) Int. Cl.$^7$ ................................................ H03K 3/00
(52) U.S. Cl. ...................................... 327/112; 327/437
(58) Field of Search ................................. 327/112, 111, 327/108, 434, 437, 170, 310, 362, 379–384; 326/26, 27, 85, 87

(56) References Cited

U.S. PATENT DOCUMENTS

| | | | | |
|---|---|---|---|---|
| 3,751,682 A | * | 8/1973 | Howe | 327/111 |
| 3,912,949 A | | 10/1975 | Kalisvaart | 307/280 |
| 4,278,918 A | * | 7/1981 | Bachofer | 327/111 |
| 4,794,283 A | * | 12/1988 | Allen et al. | 326/27 |
| 4,882,504 A | | 11/1989 | Petitjean et al. | 307/256 |
| 5,093,586 A | | 3/1992 | Asari | 307/296 |
| 5,391,939 A | * | 2/1995 | Nonaka | 326/26 |
| 6,154,069 A | * | 11/2000 | Ebihara | 327/112 |

FOREIGN PATENT DOCUMENTS

DE    3342709 A1    5/1995    ........... G08C/13/00

* cited by examiner

Primary Examiner—Toan Tran
(74) Attorney, Agent, or Firm—Steven R. Biren

(57) ABSTRACT

An electronic circuit having first ($V_{SS}$) and second ($V_{DD}$) power supply terminals and comprising a first digital driver (DRV) and a further digital driver ($DRV_F$). The digital drivers (DRV, $DRV_F$) are arranged for driving capacitive loads such as charge pump capacitors ($CP_1$, $CP_2$) of a charge pump (CHGP). The first digital driver (DRV) comprises a first field effect transistor ($T_1$) having a source coupled to the first power supply terminal ($V_{SS}$), a drain coupled for driving the first charge pump capacitor ($CP_1$), and a gate; a second field effect transistor ($T_2$) having a source coupled to the second power supply terminal ($V_{DD}$), a drain coupled to the drain of the first field effect transistor ($T_1$), and a gate; a first capacitor ($C_1$) coupled between the gate of the first field effect transistor ($T_1$) and an input terminal (CLK) for receiving a digital input signal ($U_{CLK}$); and a second capacitor ($C_2$) coupled between the gate of the second field effect transistor ($T_2$) and the input terminal (CLK). The further digital driver ($DRV_F$) is constructed in a similar way as the digital driver (DRV). DC paths are formed between the gates of field effect transistors ($T_{1-T_4}$) and the supply terminals ($V_{SS}$, $V_{DD}$). Owing to the special construction of the digital drivers (DRV, $DRV_F$), there is never a short-circuit current between the digital drivers (DRV, $DRV_F$). As a result, the digital drivers (DRV, $DRV_F$) have a very high power efficiency.

6 Claims, 3 Drawing Sheets

ELECTRONIC CIRCUIT PROVIDED WITH A DIGITAL DRIVER FOR DRIVING A CAPACITIVE LOAD

The invention relates to an electronic circuit comprising a first supply terminal and a second supply terminal and comprising a digital driver for driving a capacitive load, with an input terminal for receiving a digital input signal.

Such an electronic circuit is known from the prior art and is shown in FIG. 1. The electronic circuit has a first supply terminal $V_{SS}$ and a second supply terminal $V_{DD}$ for receiving a supply voltage which is delivered by a voltage source SV. The electronic circuit comprises a digital driver $DRV_1$, a further digital driver $DRV_2$, and a charge pump CHGP. The digital drivers are each constructed with an inverter known from the prior art in which one n-type field effect transistor and one p-type field effect transistor are used. The input of the driver $DRV_1$ is coupled to the input terminal CLK for receiving a digital input signal $U_{CLK}$. The output of the driver $DRV_1$ is coupled to the input of the further driver $DRV_2$ and to a first charge pump capacitor $CP_1$. The output of the further driver $DRV_2$ is coupled to a second charge pump capacitor $CP_2$. In this manner the charge pump capacitors $CP_1$ and $CP_2$ are controlled in counterphase.

A disadvantage of the known electronic circuit is that the transistors $T_1$ and $T_2$ may both pass current simultaneously in the time period in which the digital input signal $U_{CLK}$ changes from a high value to a low value or from a low value to a high value, which will result in a short-circuit current between the first supply terminal $V_{SS}$ and the second supply terminal $V_{DD}$. This makes the power consumption unnecessarily high.

It is an object of the invention to provide an electronic circuit with a digital driver which does not have the above disadvantage.

According to the invention, the electronic circuit mentioned in the opening paragraph is for this purpose characterized in that the digital driver comprises a first transistor with a first main current electrode which is coupled to the first supply terminal, a second main current electrode which is coupled for driving the capacitive load, and a control electrode; a second transistor with a first main current electrode which is coupled to the second supply terminal, a second main current electrode which is coupled to the second main current electrode of the first transistor, and a control electrode; a first capacitive element which is connected between the input terminal and the control electrode of the first transistor; and a second capacitive element which is connected between the input terminal and the control electrode of the second transistor.

The control electrodes of the first and the second transistor are thus connected to the input terminal not directly but via the first capacitive element and the second capacitive element, respectively. This renders it possible to adapt the voltages at the control electrodes of the first and the second transistor such that the first and the second transistor can never pass current simultaneously. A short-circuit current between the first and the second supply terminal is avoided thereby, so that the power consumption of the electronic circuit is reduced.

An embodiment of an electronic circuit according to the invention is characterized in that the electronic circuit further comprises means for providing a DC path between the control electrode of the first transistor and the first supply terminal, and for providing a DC path between the control electrode of the second transistor and the second supply terminal.

It is achieved thereby that the first or the second transistor is conductive during a short time period only. This is indeed the case immediately after a voltage level change in the digital input signal. During the remaining time, the potential of the control electrode of the first transistor is substantially equal to the potential of the first supply terminal, and the potential of the control electrode of the second transistor is substantially equal to the potential of the second supply terminal. Both the first and the second transistor do not pass current as a result of this.

Further advantageous embodiments of the invention are defined in claims 3, 4, and 5. An electronic circuit with a digital driver according to the invention may be used in various circuits in which a capacitive load is to be driven. The digital driver according to the invention may thus be used, for example, for driving charge pump capacitors of a charge pump.

The invention will be explained in more detail below with reference to the accompanying drawing, in which.

The same components or elements have been given the same reference symbols in these Figures.

Figure 1:
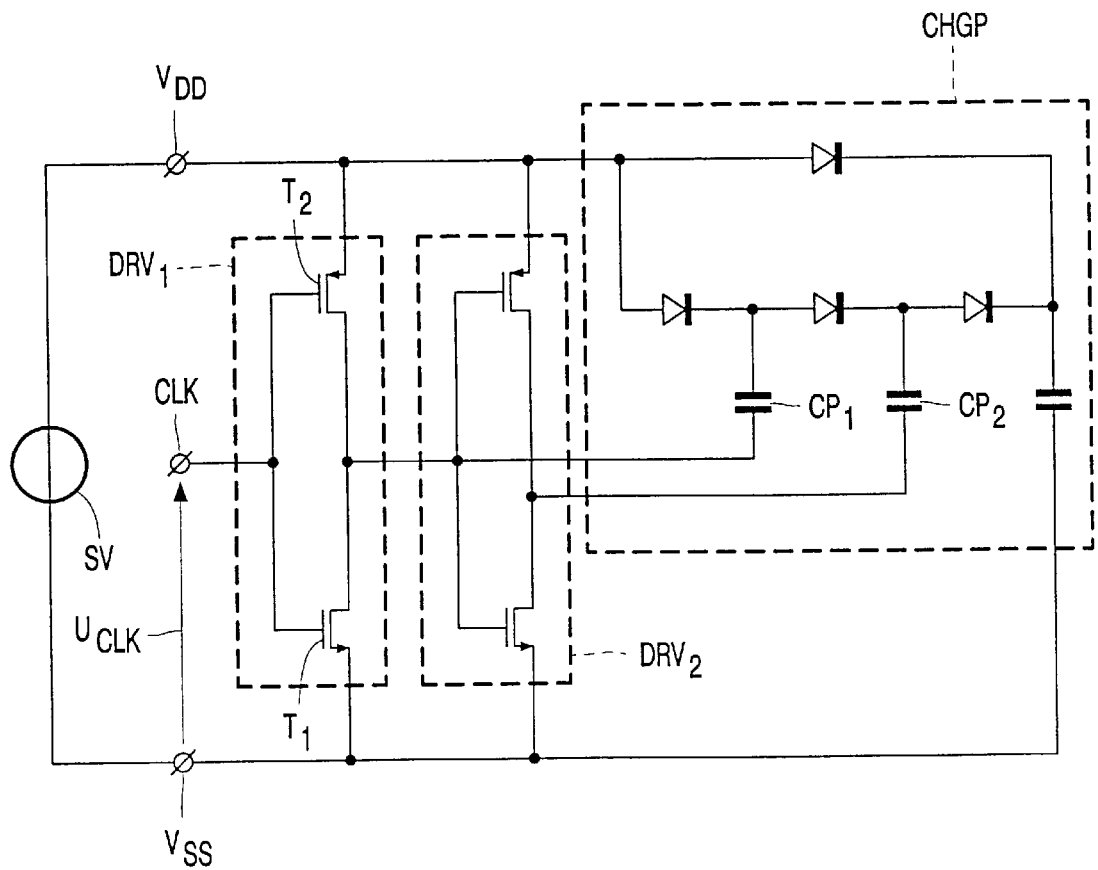
FIG. 1 shows a known electronic circuit with digital drivers and a charge pump.
Figure 2:
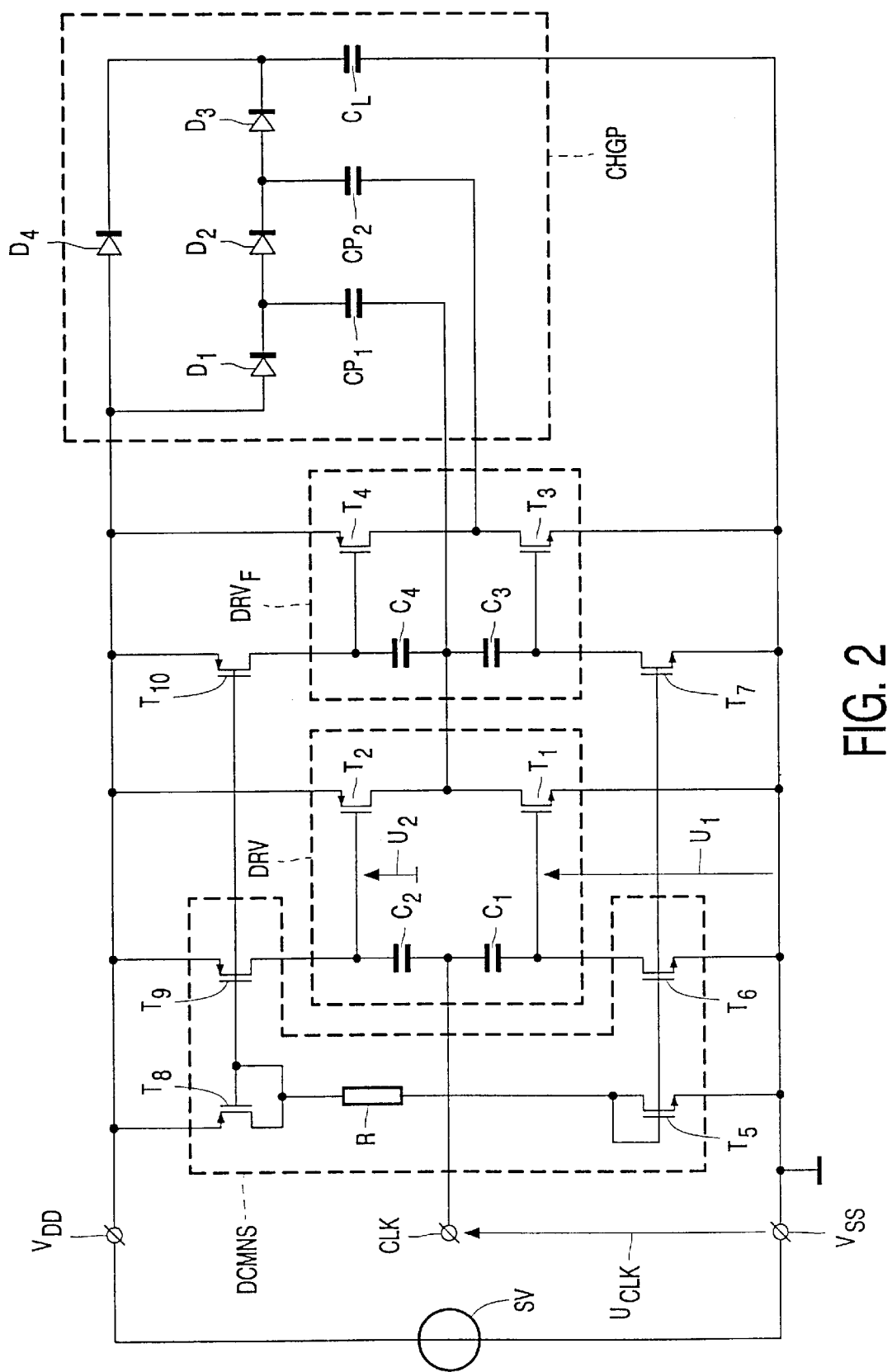
FIG. 2 is a circuit diagram of an embodiment of an electronic circuit according to the invention.

FIG. 2 is a circuit diagram of an embodiment of an electronic circuit according to the invention. The electronic circuit is supplied from a supply voltage source SV which is connected between a first supply terminal $V_{SS}$ and a second supply terminal $V_{DD}$. The electronic circuit comprises a digital driver DRV, a further digital driver $DRV_F$, and a charge pump CHGP. The digital driver DRV comprises a first field effect transistor $T_1$, a second field effect transistor $T_2$, a first capacitive element provided with a first capacitor $C_1$, and a second capacitive element provided with a second capacitor $C_2$. The sources of the first transistor $T_1$ and the second transistor $T_2$ are connected to the first supply terminal $V_{SS}$ and the second supply terminal $V_{DD}$, respectively. The drains of the first transistor $T_1$ and the second transistor $T_2$ are interconnected. The first capacitor $C_1$ is coupled between the gate of the first transistor $T_1$ and an input terminal CLK for receiving a digital input signal $U_{CLK}$. The second capacitor $C_2$ is coupled between the gate of the second transistor $T_2$ and the input terminal CLK. The electronic circuit further comprises means DCMNS for providing a DC path between the control electrode of the first transistor $T_1$ and the first supply terminal $V_{SS}$, and for providing a DC path between the control electrode of the second transistor $T_2$ and the second supply terminal $V_{DD}$. The further driver $DRV_F$ comprises a third field effect transistor $T_3$, a fourth field effect transistor $T_4$, a third capacitor $C_3$, and a fourth capacitor $C_4$. The sources of the third transistor $T_3$ and the fourth transistor $T_4$ are connected to the first supply terminal $V_{SS}$ and the second supply terminal $V_{DD}$, respectively. The drains of the third transistor $T_3$ and the fourth transistor $T_4$ are interconnected. The third capacitor $C_3$ is connected between the gate of the third transistor $T_3$ and the drains of the transistors $T_1$ and $T_2$. The fourth transistor $C_4$ is coupled between the gate of the fourth transistor $T_4$ and the drains of the first transistor $T_1$ and the second transistor $T_2$.

The means DCMNS comprise a fifth transistor $T_5$, a sixth transistor $T_6$, an eighth transistor $T_8$, a ninth transistor $T_9$, and a resistor R. The sources of the fifth transistor $T_5$ and the sixth transistor $T_6$ are connected to the first supply terminal $V_{SS}$. The sources of the eighth transistor $T_8$ and the ninth transistor $T_9$ are connected to the second supply terminal $V_{DD}$. The gate and the drain of the fifth transistor $T_5$ are interconnected. The drain and the gate of the eighth transistor $T_8$ are interconnected. The resistor R is coupled between the drain of the fifth transistor $T_5$ and the drain of the eighth transistor T8. The drain of the sixth transistor $T_6$ is connected to the gate of the first transistor $T_1$. The drain of the ninth transistor $T_9$ is connected to the gate of the second transistor $T_2$. The gate of the sixth transistor $T_6$ is connected to the gate of the fifth transistor $T_5$. The gate of the ninth transistor $T_9$ is connected to the gate of the eighth transistor $T_8$.

The electronic circuit also comprises further means for providing a DC path between the control electrode of the third transistor $T_3$ and the first supply terminal $V_{SS}$, and for providing a DC path between the control electrode of the fourth transistor $T_4$ and the second supply terminal $V_{DD}$. These further means are constructed with a seventh transistor $T_7$ and a tenth transistor $T_{10}$. The source of the seventh transistor $T_7$ is connected to the first supply terminal $V_{SS}$. The gate of the seventh transistor $T_7$ is connected to the gate of the fifth transistor $T_5$. The source of the tenth transistor $T_{10}$ is connected to the second supply terminal $V_{DD}$. The gate of the tenth transistor $T_{10}$ is connected to the gate of the eighth transistor $T_8$. The drain of the seventh transistor $T_7$ is connected to the gate of the third transistor $T_3$. The drain of the tenth transistor $T_{10}$ is connected to the gate of the fourth transistor $T_4$.

The charge pump CHGP comprises a first charge pump capacitor $CP_1$, a second charge pump capacitor $CP_2$, a capacitive load $C_L$, and first to fourth diodes $D_1$ to $D_4$. The capacitive load $C_L$ is connected by a first electrode to a first supply terminal $V_{SS}$ and by a second electrode via the fourth diode $D_4$ to the second supply terminal $V_{DD}$. The diodes $D_1$ to $D_3$ are connected in series between the second supply terminal $V_{DD}$ and the second electrode of the capacitive load $C_L$. The first charge pump capacitor $CP_1$ is connected between the drain of the second transistor $T_2$ and a common junction point of the first diode $D_1$ and the second diode $D_2$. The second charge pump capacitor $CP_2$ is connected between the drain of the fourth transistor $T_4$ and a common junction point of the second diode $D_2$ and the third diode $D_3$.

The potential at the gate of the first transistor $T_1$ with respect to the first supply terminal $V_{SS}$ is referenced $U_1$. The potential at the gate of the second transistor $T_2$ with respect to the first supply terminal $V_{SS}$ is referenced $U_2$.

The electronic circuit of FIG. 2 is an example of an electronic circuit in which digital drivers according to the invention may be used. In this case, there are two digital drivers, DRV and $DRV_F$ which are used for driving the respective charge pump capacitors $CP_1$ and $CP_2$ of the charge pump CHGP.

Instead of the charge pump CHGP shown, alternative types of charge pumps may be used. It is also possible to drive completely different circuits with the digital driver according to the invention, as long as they form capacitive loads.

Figure 3:
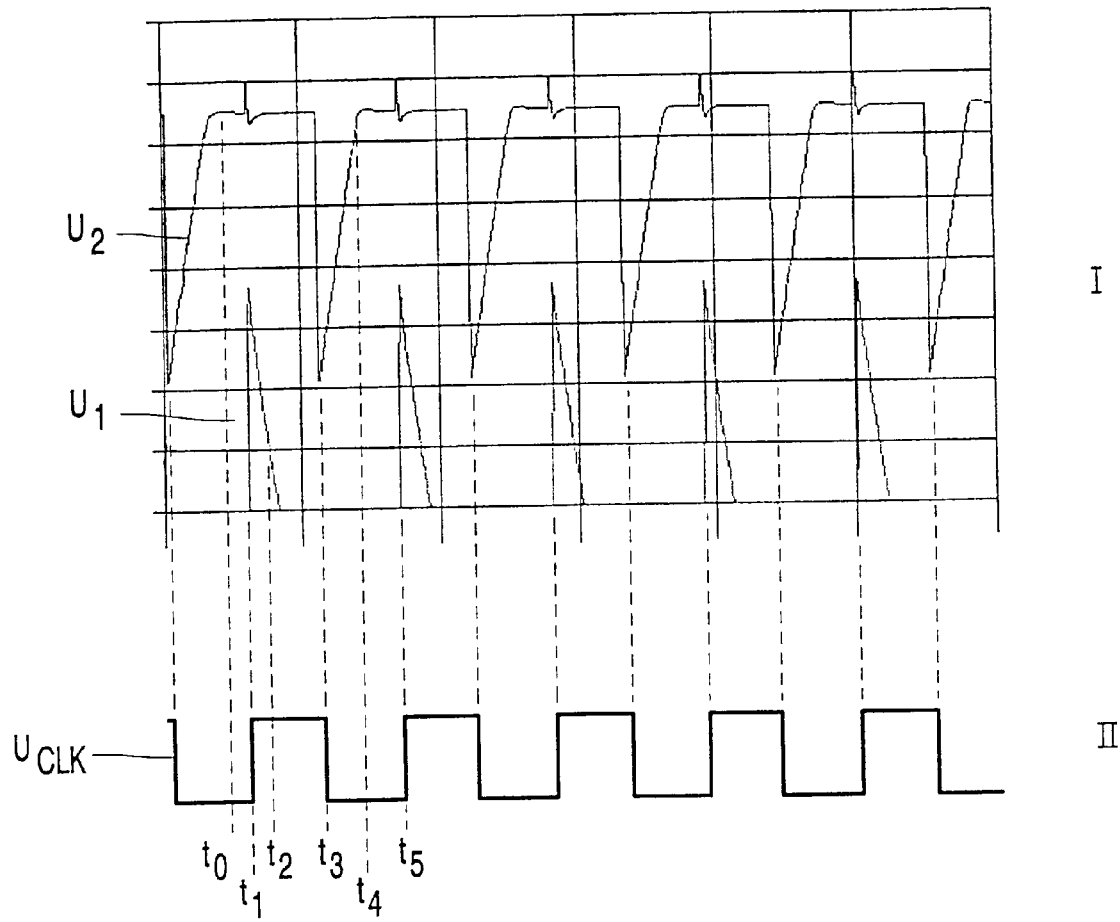
FIG. 3 is a set of signal diagrams for further clarification of the embodiment as shown in FIG. 2.

The operation of the circuit of FIG. 2 will now be explained with reference to the signal diagrams of FIG. 3.

At moment $t_0$, the value of the digital input signal $U_{CLK}$ at the input terminal CLK has been equal to approximately 0 volt for a considerable time. Since the fifth transistor $T_5$ and the eighth transistor $T_8$ are connected as diodes, the path formed by the fifth transistor $T_5$, the resistor R, and the eighth transistor $T_8$ always conducts current. As a result, the sixth transistor $T_6$ forms a conductive DC path between the gate of the first transistor $T_1$ and the first supply terminal $V_{SS}$, and the ninth transistor $T_9$ forms a DC path between the gate of the second transistor $T_2$ and the second supply terminal $V_{DD}$. This renders the gate-source voltage of the first transistor $T_1$ and the gate-source voltage of the second transistor $T_2$ substantially equal to 0 volt. Since the potential at the input terminal CLK is substantially equal to the potential at the first supply terminal $V_{SS}$, the voltage across the first capacitor $C_1$ is substantially equal to 0 volt, and the voltage across the second capacitor $C_2$ is substantially equal to the supply voltage delivered by the supply voltage source SV. Both the first transistor $T_1$ and the second transistor $T_2$ do not pass current. At moment $t_1$, the digital input signal $U_{CLK}$ changes from a low value to a high value. This makes the potential at the input terminal CLK substantially equal to the supply voltage. The gate-source voltage of the first transistor $T_1$, indicated with $U_1$, temporarily assumes a high value. This is because the gate of the first transistor $T_1$ is coupled to the input terminal CLK via the first capacitor $C_1$. However, the sixth transistor $T_6$ is always in the conducting state. As a result, $U_1$ will become equal to approximately 0 volt fairly quickly again.

The voltage across the first capacitor $C_1$ has now become equal to the supply voltage. Since the potential at the gate of the second transistor $T_2$ is equal to the potential at the input terminal CLK, the voltage across the second capacitor $C_2$ is equal to approximately 0 volt now. At moment $t_3$, the digital input signal $U_{CLK}$ changes from a high value to a low value. This makes the potential at the input terminal CLK approximately equal to the potential at the first supply terminal $V_{SS}$ again. The second capacitor $C_2$ is not charged at that moment, so that the voltage $U_2$ becomes substantially equal to 0 volt. This is only temporary, because the ninth transistor $T_9$ is always in the conducting state, and $U_2$ will become equal to the supply voltage fairly quickly again.

The first transistor $T_1$, accordingly, passes current for a short time only, i.e. whenever the digital input signal $U_{CLK}$ has switched from a low value to a high value. The second transistor $T_2$ passes current for a short time only whenever the digital input signal $U_{CLK}$ changes from a high value to a low value. It is achieved thereby that the digital driver DRV consumes only little power. The further digital driver $DRV_F$ operates in a similar manner as the digital driver DRV. The functions of the seventh transistor $T_7$ and the tenth transistor $T_{10}$ correspond to the respective functions of the sixth transistor $T_6$ and the ninth transistor $T_9$.

The means DCMNS for providing a DC path between the gate of the first transistor $T_1$ and the first supply terminal $V_{SS}$ and between the gate of the second transistor $T_2$ and the second supply terminal $V_{DD}$ may be implemented in an alternative manner. This may be done, for example, through the provision of a high-ohmic resistance between the gate and the source of the first transistor $T_1$ and between the gate and the source of the second transistor $T_2$.

The electronic circuit may be composed from discrete components or may be used in an integrated circuit. Both field effect transistors and bipolar transistors may be used. A combination of field effect transistors and bipolar transistors may also be used. It is also possible to replace all p-conductivity type transistors with n-conductivity type transistors, provided that all n-conductivity type transistors are replaced with p-conductivity type transistors at the same time.

What is claimed is:
1. An electronic circuit comprising a first supply terminal ($V_{SS}$) and a second supply terminal ($V_{DD}$) and comprising a digital driver (DRV) for driving a capacitive load, with an input terminal (CLK) for receiving a digital input signal ($U_{CLK}$), characterized in that the digital driver (DRV) comprises a first transistor ($T_1$) with a first main current electrode which is coupled to the first supply terminal ($V_{SS}$), a second main current electrode which is coupled for driving the capacitive load, and a control electrode; a second transistor ($T_2$) with a first main current electrode which is coupled to the second supply terminal ($V_{DD}$), a second main current electrode which is coupled to the second main current electrode of the first transistor ($T_1$), and a control electrode; a first capacitive element ($C_1$) which is connected between the input terminal (CLK) and the control electrode of the first transistor ($T_1$); and a second capacitive element ($C_2$) which is connected between the input terminal (CLK) and the control electrode of the second transistor ($T_2$), wherein the electronic circuit further comprises a first current mirror ($T_{5-T6}$) with an input and with an output coupled to the control electrode of the first transistor ($T_1$); and a second current mirror ($T_{8-T9}$) with an input and with an output coupled to the control electrode of the second transistor ($T_2$); and a resistive element (R) coupled between the input of the first current mirror ($T_{5-T6}$) and the input of the second current mirror ($T_{8-T9}$).

2. An electronic circuit as claimed in claim 1, characterized in that the electronic circuit further comprises means (DCMNS) for providing a DC path between the control electrode of the first transistor ($T_1$) and the first supply terminal ($V_{SS}$), and for providing a DC path between the control electrode of the second transistor ($T_2$) and the second supply terminal ($V_{DD}$).

3. An electronic circuit as claimed in claim 1, characterized in that the electronic circuit further comprises a first current source coupled between the control electrode of the first transistor ($T_1$) and the first supply voltage terminal ($V_{SS}$), and a second current source coupled between the control electrode of the second transistor ($T_2$) and the second supply voltage source ($V_{DD}$).

4. An electronic circuit comprising a first supply terminal ($V_{SS}$) and a second supply terminal ($V_{DD}$) and comprising a digital driver (DRV) for driving a capacitive load, with an input terminal (CLK) for receiving a digital input signal ($U_{CLK}$), characterized in that the digital driver (DRV) comprises a first transistor ($T_1$) with a first main current electrode which is coupled to the first supply terminal ($V_{SS}$), a second main current electrode which is coupled for driving the capacitive load, and a control electrode; a second transistor ($T_2$) with a first main current electrode which is coupled to the second supply terminal ($V_{DD}$), a second main current electrode which is coupled to the second main current electrode of the first transistor ($T_1$), and a control electrode; a first capacitive element ($C_1$) which is connected between the input terminal (CLK) and the control electrode of the first transistor ($T_1$); and a second capacitive element ($C_2$) which is connected between the input terminal (CLK) and the control electrode of the second transistor ($T_2$), wherein the electronic circuit further comprises a further digital driver ($DRV_F$) with an input connected to the output of the digital driver (DRV), and with an output; and a charge pump (CHGP) with a first charge pump capacitor ($CP_1$) coupled to the output of the first digital driver (DRV) and a second charge pump capacitor ($CP_2$) coupled to the output of the further digital driver ($DRV_F$).

5. An electronic circuit as claimed in claim 4, characterized in that the electronic circuit further comprises means (DCMNS) for providing a DC path between the control electrode of the first transistor ($T_1$) and the first supply terminal ($V_{SS}$), and for providing a DC path between the control electrode of the second transistor ($T_2$) and the second supply terminal ($V_{DD}$).

6. An electronic circuit as claimed in claim 4, characterized in that the electronic circuit further comprises a first current source coupled between the control electrode of the first transistor ($T_1$) and the first supply voltage terminal ($V_{SS}$), and a second current source coupled between the control electrode of the second transistor ($T_2$) and the second supply voltage source ($V_{DD}$).

* * * * *